United States Patent
Michalski

(10) Patent No.: US 6,778,010 B1
(45) Date of Patent: Aug. 17, 2004

(54) AMPLIFIER SLEW-RATE ENHANCEMENT SYSTEMS FOR USE WITH SWITCHED-CAPACITOR STRUCTURES

(75) Inventor: Christopher Michalski, High Point, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/463,953

(22) Filed: Jun. 18, 2003

(Under 37 CFR 1.47)

Related U.S. Application Data
(60) Provisional application No. 60/389,471, filed on Jun. 18, 2002.

(51) Int. Cl.[7] .................................................. H03F 1/02

(52) U.S. Cl. ............................ 330/9; 330/253; 330/257

(58) Field of Search ................................. 330/252, 253, 330/257, 255, 256, 9

(56) References Cited

U.S. PATENT DOCUMENTS

| | | | |
|---|---|---|---|
| 5,512,859 A | | 4/1996 | Moraveji ..................... 330/267 |
| 5,515,003 A | * | 5/1996 | Kimura ....................... 330/253 |
| 5,917,378 A | | 6/1999 | Juang ......................... 330/253 |
| 6,377,120 B1 | * | 4/2002 | Hsieh ......................... 330/253 |

OTHER PUBLICATIONS

Michaslki, Christopher, "A 12b 105Msample/S, 850 mW Analog to Digital Converter", VLSI Symposia on Circuits held in 2000 in Hawaii, USA.

* cited by examiner

*Primary Examiner*—Michael B. Shingleton
(74) *Attorney, Agent, or Firm*—Koppel, Jacobs, Patrick & Heybl

(57) ABSTRACT

High-speed differential amplifiers are provided for use with switched-capacitor structures. These amplifiers reduce current demand during small-signal operation and generate high slew currents during large-signal operation. These processes are realized with slew-current generation structures that directly generate slew currents during large-signal operation and thus avoid the degradation of intermediate current-genration structures.

25 Claims, 3 Drawing Sheets

AMPLIFIER SLEW-RATE ENHANCEMENT SYSTEMS FOR USE WITH SWITCHED-CAPACITOR STRUCTURES

CROSS REFERENCES TO RELATED APPLICATIONS

This application claims the benefit of U.S. Provisional Application Serial No. 60/389,471 filed Jun. 18, 2002.

BACKGROUND OF THE INVENTION

1. Field of the Invention

The present invention relates generally to switched-capacitor systems and, more particularly, to differential amplifiers in such systems.

2. Description of the Related Art

FIG. 1 illustrates a switched-capacitor system 20 in which a sample capacitor $C_s$ has a top plate 21 coupled to the inverting input of a differential amplifier 22 and a bottom plate 23 coupled through an input sample switch 24 to an input port 25. The differential amplifier 22 drives an output port 26 and a transfer capacitor $C_t$ is coupled across the differential amplifier. The differential amplifier has a high gain so that its non-inverting input has substantially the same potential as its inverting input. Finally, a second sample switch 27 and a transfer switch 28 are respectively coupled to the top and bottom plates 21 and 23.

In an operational sample mode, the input and second sample switches 24 and 27 are closed so that an analog input signal $S_{in}$ at the input port 25 urges a sample charge $Q_s$ into the sample capacitor $C_s$ to thereby acquire a sample signal $S_s = Q_s/C_s$ across the sample capacitor. In an operational transfer mode, the first and second sample switches 24 and 27 are opened and the transfer switch 28 is closed to transfer the sample charge $Q_s$ into the transfer capacitor $C_t$ and thus generate an output signal $S_{out} = Q_s/C_t$ at the output port 26.

The switched-capacitor system 20 of FIG. 1 is thus formed with the differential amplifier 22 and a switched-capacitor structure 29 that incudes the sample and transfer capacitors $C_s$ and $C_t$. The switched-capacitor structure 29 acquires a sample signal $S_s$ in a sample mode and the differential amplifier processes the sample signal $S_s$ into the output signal $S_{out}$ across the output capacitor during the transfer mode. A transfer function of $C_s/C_t$ is thus realized and this transfer function is represented in the graph 30 of FIG. 2 by a plot 32 which has a slope of $C_s/C_t$.

The switched-capacitor system 20 (and differential versions thereof) is especially suited for use as a sampler in a variety of signal conditioning systems (e.g., pipelined analog-to-digital converters (ADCs)). In such systems, the switches of the system 20 of FIG. 1 are typically realized with complementary metal-oxide-semiconductor (CMOS) transistors. This realization is exemplified in FIG. 1 by a CMOS transistor 34 that is substituted for the input sample switch 24 as indicated by the substitution arrow 35.

In pipelined ADCs, an initial ADC stage (e.g., a flash ADC) typically converts an analog input signal into at least one most-significant bit $D_o$ of a digital output signal that corresponds to the input signal $S_{in}$. At the same time, the sampled signal is processed into a residue signal $S_{res}$ that is suitable for subsequent processing by downstream ADC stages into the less-significant bits of the output digital signal.

If the initial ADC stage is a 1.5 bit converter stage, for example, it provides a residue signal $S_{res}$ that corresponds to the plot 36 in FIG. 2 which has two steps 37 that are equally spaced from the midpoint of the range of the input signal $S_{in}$. The steps are initiated by decision signals from the initial ADC stage. The plot 36 of the residue signal $S_{res}$, therefore, has three segments defined by the steps 37 and each segment has a slope that is twice the slope of the plot 32.

The residue signal illustrated by the plot 36 can be generated, for example, by supplementing the sample capacitor $C_s$ of FIG. 1 with an additional sample capacitor to realize the increased slope (i.e., increased gain) and by replacing the transfer switch 28 with a multipole transfer switch 38 as indicated by the substitution arrow 39. The transfer switch responds to digital decision signals $S_{dgtl}$ from the initial ADC stage by applying selected offset signals (e.g., +V and −V) to the bottom plate of at least one of the sample capacitors and the offset signals generate the steps 37 in the plot 32 of FIG. 2. When the switched-capacitor system 20 of FIG. 1 is modified in this fashion, it is typically referred to as a multiplying digital-to-analog converter (MDAC).

The operational speed of switched-capacitor systems (e.g., samplers and MDACs) is highly dependent upon the ability of an associated operational amplifier (e.g, the amplifier 22 of FIG. 1) to rapidly transfer the sample charge $Q_s$ in the sample capacitor $C_s$ into the transfer capacitor $C_t$ during the transfer mode. Although operational amplifiers often incorporate slew current strucutures to speed up this charge transfer, they typically (e.g., see Michaslki, Christopher, "A 12b 105 Msample/S, 850 mW Analog to Digital Converter", VLSI Symposia on Circuits held in 2000 in Hawaii, USA) introduce intermediate structures (e.g., current mirrors) that degrade the speed of the transfer process.

BRIEF SUMMARY OF THE INVENTION

The present invention is directed to high-speed differential amplifiers for use with switched-capacitor structures. These amplifiers reduce current demand during small-signal operation and generate high slew currents during large-signal operation.

These processes are realized with slew-current generation structures that directly generate slew currents during large-signal operation and thus avoid the degradation of intermediate current-genration structures.

The novel features of the invention are set forth with particularity in the appended claims. The invention will be best understood from the following description when read in conjunction with the accompanying drawings.

DETAILED DESCRIPTION OF THE INVENTION

Figure 3:
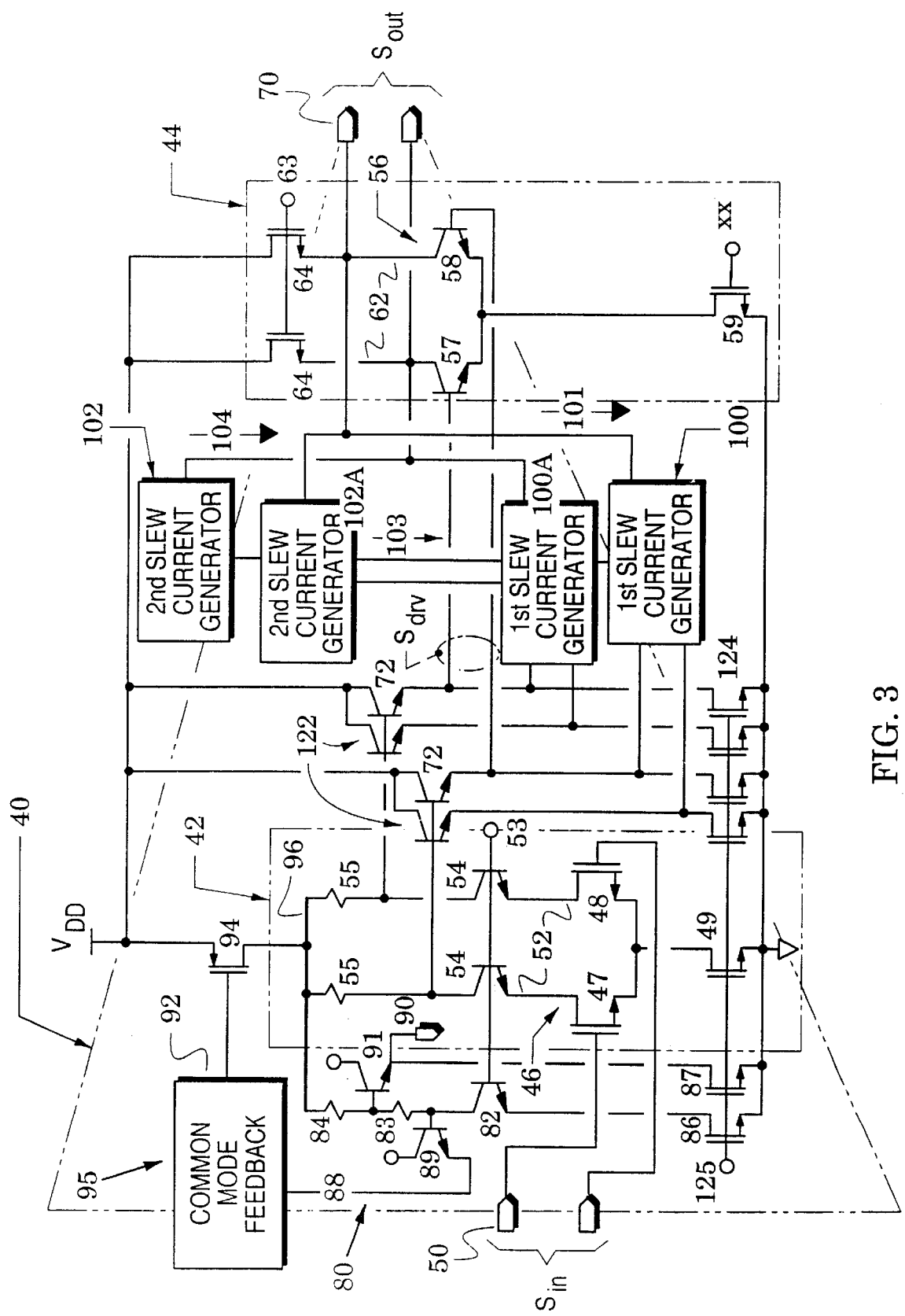
FIG. 3 is a diagram of a differential amplifier embodiment of the present invention for use in the switched-capacitor systems of FIG. 1.

FIG. 3 illustrates an amplifier 40 which is especially suited for operation in switched-capacitor structures because it is configured to deliver high slew currents that enhance the operational speed of these structures. Its configuration reduces current demand during small-signal operation and generates high slew currents during large-signal operation. Accordingly, sample charges $Q_s$ can be transferred rapidly into the transfer capacitor $C_t$ of a switched-capacitor structure during its transfer mode.

The amplifier 40 is configured with the realization that intermediate slew-current generation structures degrade the transfer process and thus decrease operational speed. The amplifier is therefore configured to directly generate first and second slew currents in an output amplifier stage.

Specifically, the amplifier 40 includes initial and output amplifier stages 42 and 44. The initial stage 42 has an initial differential pair 46 of initial transistors 47 and 48 that steer the current of a current source 49 in response to a differential input signal $S_{in}$ at a differential input port 50. The differential pair 46 has initial current terminals (e.g., drains) 52 that are coupled through cascoded common-base transistors 54 (biased by a bias signal 53) to resistor loads 55.

The output stage 44 has an output differential pair 56 of output transistors 57 and 58 that steer the current of a current source 59 in response to a differential drive signal $S_{drv}$. The differential pair 56 has output current terminals (e.g., collectors) 62 that are coupled through at least one active load in the form of common-gate transistors 64 (biased by a bias signal 63) to a supply voltage $V_{DD}$. The output differential pair 56 provides a differential output signal $S_{out}$ at a differential output port 70 in response to a differential drive signal $S_{drv}$ that is provided by the initial differential pair 46.

The amplifier 40 preferably includes first and second buffers (e.g., emitter followers) 72 that are inserted between the initial differential pair 46 and the output differential pair 56 to thereby level shift and provide the differential drive signal $S_{drv}$ to the output differential pair. The amplifier further includes a bias network 80 in which a transistor 82 receives the bias 53 and is coupled between serially-connected resistors 83 and 84 and a current source 86. The bias network 80 provides a feedback signal 88 via a buffer 89 and an offset signal 90 via a buffer 91 that is coupled to a current source 87.

A common-mode feedback system 92 is coupled between the feedback signal 88 and a feedback transistor 94 that is coupled between the supply voltage $V_{DD}$ and a control rail 96. In a feature of the invention, a feedback loop 95 is thus formed which responds to the feedback signal 88 and controls the level of the control rail 96 so that common-mode level of the differential drive signal $S_{drv}$ is precisely maintained.

The amplifier 40 futher includes first slew current generators 100 that each receive a respective side of the differential drive signal $S_{drv}$ from a resepective one of the first and second buffers 72 and, in response, provide a first slew current 101 to a respective one of the output current terminals 62. It also includes second slew current generators 102 that each receive a current signal 103 from a resepective one of the first slew current generators 100 and, in response, provide a second slew current 104 to a respective one of the output current terminals 62.

Figure 4B:
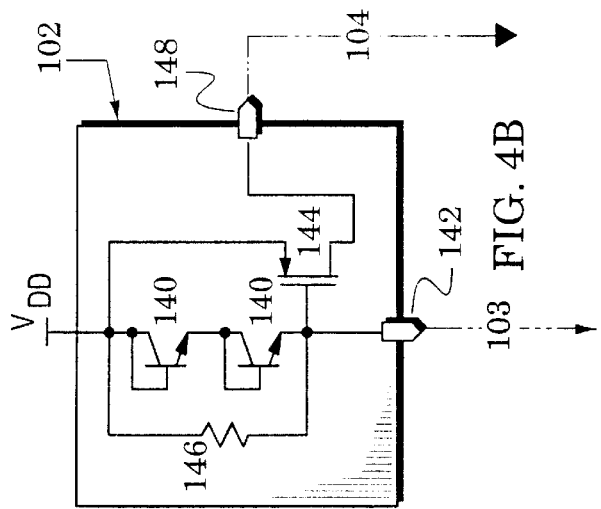
FIGS. 4A and 4B are digrams of structures within first and second slew current generators in the differential amplifier of FIG. 3.
Figure 4A:
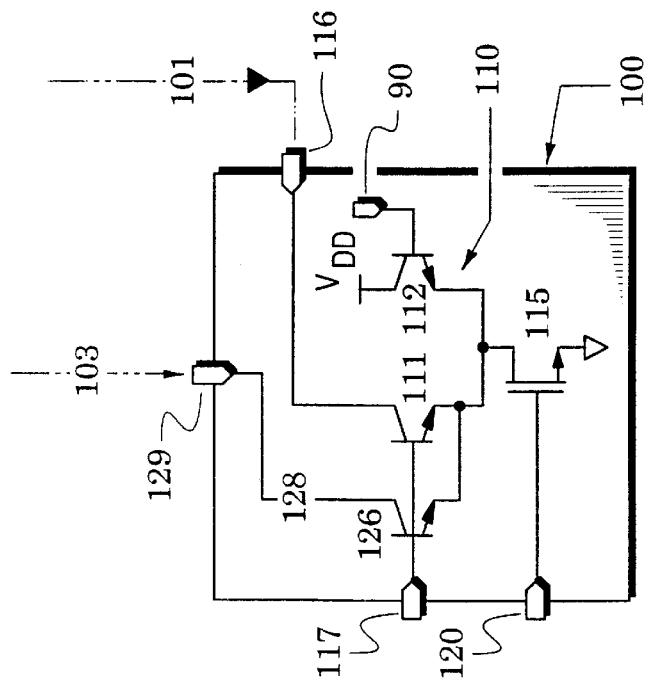

FIG. 4A shows that structures of the first slew current generator 100 include a differential pair 110 of slew transistors 111 and 112 which steer a first slew current 101 (introduced in FIG. 3) from a current source 115 to a first slew port 116 in response to a respective side of the differential drive signal (signal $S_{drv}$ in FIG. 3) which is received through a drive port 117. The slew transistor 112 responds to the offset signal 90 that is provided by the bias network 80 of FIG. 3.

The current source 115 is initiated by a respective side of the differential drive signal $S_{drv}$ which is received through a second drive port 120. The drive signal is preferably provided by a buffer 122 in FIG. 3 that is coupled to a respective one of the buffers 72. As shown in FIG. 3, these buffers are coupled to current sources 124 that receive (along with current sources 49, 86 and 87) a bias signal 125.

The first slew current generator 100 of FIG. 4A also includes a diversion transistor 126 that is coupled to the slew transistor 111 to divert a current portion of that slew transistor's first slew current to thereby form the current signal 103 at a diversion port 129.

FIG. 4B shows that structures of the second slew current generator 102 include a pair of diode-connected transistors 140 which are serially-coupled between the supply voltage and a diversion port 142. Current and control terminals of a slew transistor 144 are coupled about the diode-connected transistors 140 as is also a resistor 146. The other current terminal of the slew transistor 144 is coupled to a slew port 148. The current signal 103 (from the first slew current generator 100 of FIG. 4A) is received at the diversion port 142 and its passage through the diode-connected transistors generates a voltage which initiates the second slew current 104 in the slew transistor 144.

In a non-slew small-signal operation of the amplifier 40 of FIG. 3, the initial differential pair 46 receives the dfferential input signal $S_{in}$ from the differential input port 50 and, in response, generates the differential drive signal $S_{drv}$ at the output of the buffers 72. The output differential pair 56 responds to the differential drive signal $S_{drv}$ and provides the differential output signal $S_{out}$ at the differential output port 70.

Because it stablizes the voltage level of the control rail 96, the common-mode feedback loop 95 maintains a substantially-constant common-mode level of the initial currrent terminals 52 and of the differential drive signal $S_{drv}$. The common-mode level of the differential drive signal $S_{drv}$ is received by the slew transistor 111 of the first slew generator 100 of FIG. 4A.

The control process of the feedback loop 95 permits the bias network 80 of FIG. 3 to provide a offset reference signal 90 to the slew transistor 112 of FIG. 4A that is sufficiently offset from the common-mode level at the slew transistor 111 so that the differential pair 110 does not steer current to the slew port 116. In addition, the feedback loop 95 of FIG. 3 is configured so that the offset reference signal 90 tracks the common-mode level over process and temperature variations so that the offset between them remains substantially constant.

In another important feature of the invention, power consumption is reduced by turning off the current source 115 of FIG. 4A whenever its current is not needed. Because the differential pair 110 does not steer current to the slew port 116 during the small-signal operation, the common-mode level is controlled so that signals from the buffer 122 of FIG. 3 do not turn on the current source 115 of FIG. 4A at this time.

Because there is no current steered through the slew transistor 111, the diversion transistor 126 also fails to divert a current signal 103 (see FIGS. 3, 4A and 4B) to the second slew generator 102 of FIG. 4B so that it does not generate the second slew current 104. In summary, the first and second slew generators 100 and 102 of FIGS. 4A and 4B do not provide slew currents 101 and 104 during small-signal opertion of the amplifier 40 of FIG. 3 and no current is consumed by the current source 115 of FIG. 4A.

In a large-signal operation of the amplifier 40 of FIG. 3, one side of the differential drive signal $S_{drv}$ of FIG. 4 rises sufficiently (e.g., by a few hundred millivolts) to turn on (via a buffer 122 of FIG. 3) the current source 115 of FIG. 4A. Because this rise exceeds the offset reference signal 90 in FIG. 4A, this side of the differential drive signal $S_{drv}$ also turns on (via a buffer 72 of FIG. 4) the slew transistor 111 and turns off slew transistor 112.

Accordingly, the differential pair 110 of FIG. 4A steers the current of the current source 115 and thereby generates the first slew current 101. Diversion transistor 126 is also turned on and diverts a current portion (the current signal 103) to the second slew current generator 102 of FIG. 4B where it flows across the diode-connected transistors 140 and turns on the slew transistor 144 to, thereby, generate the second slew current 104. When the respective side of the differential drive signal $S_{drv}$ of FIG. 4 subsequently falls, the first slew current 101, the current signal 103 and the second slew current 104 are all terminated.

The slew transistors 111 and 112 and the diversion transistor 126 of FIG. 4A and the diode-connected transistors 140 of FIG. 4B are all preferably bipolar junction transistors which inherently have high transconductances $g_m$. In another important feature of the invention, it is noted that the first slew current 101 is directly generated by the high transconductance $g_m$ of the slew transistor 111. That is, no intermediate structures (e.g., current mirrors) are introduced that would delay generation of the first slew current 101.

In another feature of the invention, the high transconductance $g_m$ of the diversion transistor 126 and the diode-connected transistors 140 directly generates the second slew current 104 in the slew transistor 144 The same high transconductances $g_m$ also cause the slew transistor 111, the diversion transistor 126 and the diode-connected transistors 140 to rapidly turn off the first and second slew currents 101 and 104 when the respective side of the differential drive signal $S_{drv}$ of FIG. 4 subsequently falls. The resistor 146 of FIG. 4B provides a path for large discharge currents from the diode-connected transistors.

It is noted in FIG. 3 that the side of the differential drive signal $S_{drv}$ that turns on the first slew current 101 will also turn on the ouput tranistor 58 which pulls down the signal at its output collector 62. The first slew current 101 thus forms a sink current in this same collector that boosts the sink current of the output transistor 58. In contrast, the second slew current 104 forms a source current in the ouput collector of the other output transistor 57. Thus the first and second slew currents 101 and 104 significantly enhance the response time of the differential output signal $S_{out}$ at the output port 70.

The large-signal operational description above is repeated when the other side of the differential drive signal $S_{drv}$ of FIG. 4 rises. In this case, the first and second slew currents are provided by the first slew current generator 100A and the second slew current genrator 102A. It is further noted that the first slew currents 101 form sink currents in the ouput collectors 62 and the second slew currents 104 form source currents in these output collectors wherein the first and second directions of these currents are always opposite.

Figure 2:
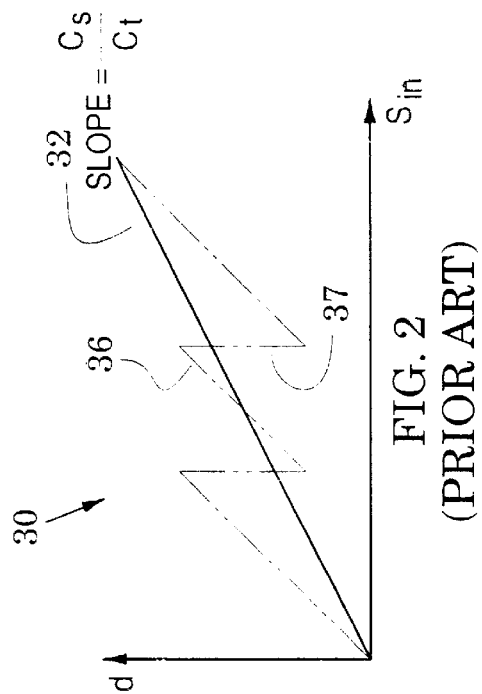
FIG. 2 is a graph which shows transfer functions in the switched-capacitor systems of FIG. 1.
Figure 1:
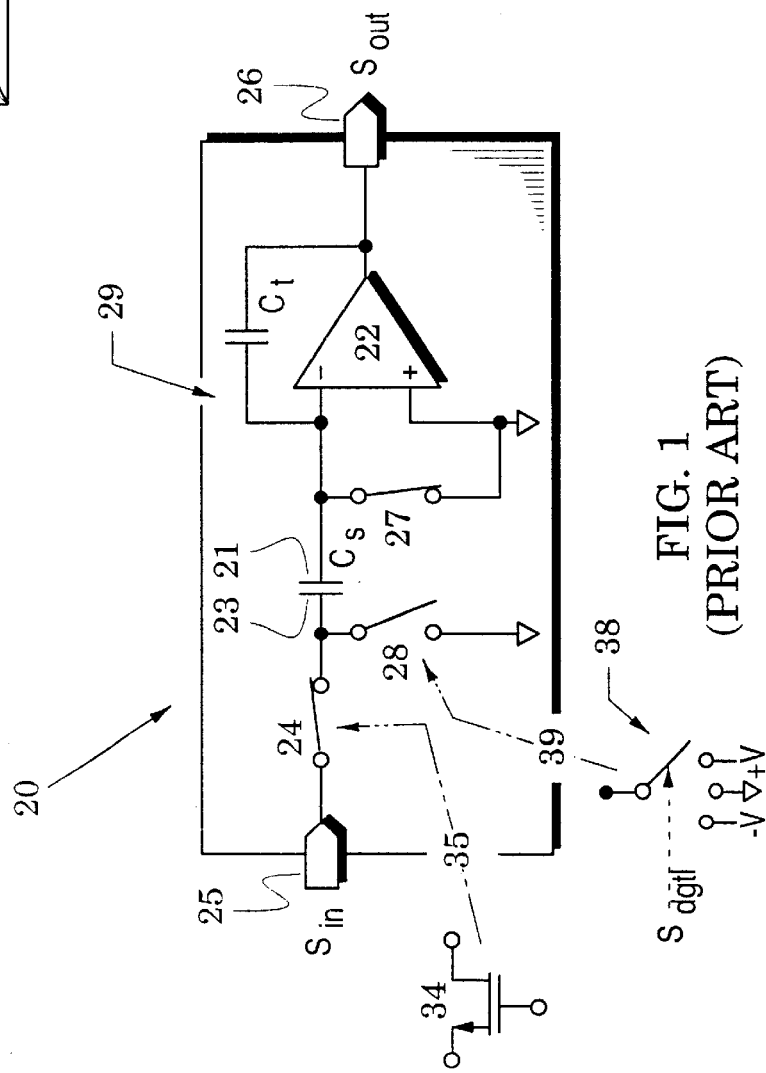
FIG. 1 is a schematic of exemplary switched-capacitor systems.

The amplifier 40 of FIG. 3 is especially suited for use in switched-capacitor structures such as the structure 29 of FIG. 1. During the transfer mode of this structure, the sample charge $Q_s$ in the sample capacitor $C_s$ must be rapidly transferred into the transfer capacitor $C_t$ to enhance the opearational speed of the switched-capacitor structure. The response time of this transfer is significantly enhanced by the directly-generated first and second slew currents 101 and 104 of the amplifier 40.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An amplifier that provides a differential output signal in response to a differential input signal, comprising:

an initial differential pair of initial transistors that provide a differential drive signal in response to said differential input signal;

an output differential pair of output transistors that have output current terminals and provide said differential output signal at said output current terminals in response to said differential drive signal;

first and second differential pairs of slew transistors wherein each of said differential pairs steers a first slew current to a first direction in a respective one of said output current terminals in response to a respective side of said differential drive signal;

first and second diversion transistors that are each coupled to a slew transistor of a respective one of said differential pairs to divert a current portion of that slew transistor's first slew current; and first and second current generators that each respond to a respective current portion and generate and guide a second slew current to a second direction in a respective one of said output current terminals;

wherein said second direction is the opposite of said first direction and said first and second slew currents are coupled so that, in response to each side of said differential drive signal, one of said output current terminals is provided with a first slew current in said first direction and the other of said output current terminals is provided with a second slew current in said second direction.

2. The amplifier of claim 1, wherein each of said first and second current generators includes:

at least one diode-connected transistor that receives a respective current portion; and a second slew transistor coupled across said diode-connected transistor to thereby generate a respective second slew current.

3. The amplifier of claim 2, further including a resistor coupled to said diode-connected transistor to enhance current termination in said diode-connected transistor.

4. The amplifier of claim 2, wherein said diode-connected transistor is a diode-connected bipolar junction transistor and said second slew transistor is a complementary metal-oxide-semiconductor (CMOS) transistor.

5. The amplifier of claim 1, further including first and second buffers inserted between said initial differential pair and said output differential pair to thereby provide said differential drive signal.

6. The amplifier of claim 5, wherein said buffers are emitter followers.

7. The amplifier of claim 1, further including first and second current sources that each provide a first slew current to a respective one of said first and second differential pairs in response to a respective side of said differential drive signal.

8. The amplifier of claim 1, wherein said initial transistors are complementary metal-oxide-semiconductor (CMOS)

transistors, said output transistors are bipolar junction transistors and said output current terminals are output collectors.

9. The amplifier of claim 1, wherein said initial transistors have initial current terminals and further including a common-mode feedback loop that controls a common-mode level of said initial current terminals in response to a common-mode reference signal.

10. The amplifier of claim 9, further including a bias network that provides an offset reference signal to said first and second differential pairs that is sufficiently offset from said common-mode level to terminate said response of said first and second differential pairs when the magnitude of said differential drive signal drops below a predetermined level.

11. The amplifier of claim 9, wherein said initial transistors are complementary metal-oxide-semiconductor (CMOS) transistors and said initial current terminals are initial drains.

12. An amplifier that provides a differential output signal in response to a differential input signal, comprising:
   an initial differential pair of initial transistors that have intial current terminals and provide a differential drive signal in response to said differential input signal;
   a common-mode feedback loop that controls a common-mode level of said initial current terminals in response to a common-mode reference signal;
   an output differential pair of output transistors that have output current terminals and provide said differential output signal at said output current terminals in response to said differential drive signal;
   first and second differential pairs of slew transistors wherein each of said differential pairs steers a respective first slew current to a first direction in a respective one of said output current terminals in response to a respective side of said differential drive signal;
   first and second current generators that each respond to a current portion of a respective one of said first slew currents and generate and guide a second slew current to a second direction in a respective one of said output current terminals; and
   a bias network that provides an offset reference signal to said first and second differential pairs that is sufficiently offset from said common-mode level to terminate said response of said first and second differential pairs when the magnitude of said differential drive signal drops below a predetermined level;
   wherein said second direction is the opposite of said first direction and said first and second slew currents are coupled so that, in response to each side of said differential drive signal, one of said output current terminals is provided with a first slew current in said first direction and the other of said output current terminals is provided with a second slew current in said second direction.

13. The amplifier of claim 12, wherein each of said first and second current generators includes:
   at least one diode-connected transistor that receives a respective current portion; and
   a second slew transistor coupled across said diode-connected transistor to thereby generate a respective second slew current.

14. The amplifier of claim 13, further including a resistor coupled to said diode-connected transistor to enhance current termination in said diode-connected transistor.

15. The amplifier of claim 12, further including first and second emitter followers inserted between said initial differential pair and said output differential pair to thereby provide said differential drive signal.

16. The amplifier of claim 12, further including first and second current sources that each provide a first slew current to a respective one of said first and second differential pairs in response to a respective side of said differential drive signal.

17. A switched-capacitor system that samples an analog input signal in a sample mode and provides a corresponding output signal in a transfer mode, the system comprising:
   a switched-capacitor structure that incudes an output capacitor and that acquires a sample signal in said sample mode;
   a differential amplifier coupled across said output capacitor to process said sample signal into said output signal during said transfer mode wherein said differential amplifier includes:
   a) an initial differential pair of initial transistors that provide a differential drive signal in response to said differential input signal;
   b) an output differential pair of output transistors that have output current terminals and provide said differential output signal at said output current terminals in response to said differential drive signal;
   c) first and second differential pairs of slew transistors wherein each of said differential pairs steers a first slew current to a first direction in a respective one of said output current terminals in response to a respective side of said differential drive signal;
   d) first and second diversion transistors that are each coupled to a slew transistor of a respective one of said differential pairs to divert a current portion of that slew transistor's first slew current; and
   e) first and second current generators that each respond to a respective current portion and generate and guide a second slew current to a second direction in a respective one of said output current terminals;
   wherein said second direction is the opposite of said first direction and said first and second slew currents are coupled so that, in response to each side of said differential drive signal, one of said output current terminals is provided with a first slew current in said first direction and the other of said output current terminals is provided with a second slew current in said second direction.

18. The amplifier of claim 17, wherein each of said first and second current generators includes:
   at least one diode-connected transistor that receives a respective current portion; and
   a second slew transistor coupled across said diode-connected transistor to thereby generate a respective second slew current.

19. The amplifier of claim 18, further including a resistor coupled to said diode-connected transistor to enhance current termination in said diode-connected transistor.

20. The amplifier of claim 17, further including first and second emitter followers inserted between said initial differential pair and said output differential pair to thereby provide said differential drive signal.

21. The amplifier of claim 17, further including first and second current sources that each provide a first slew current to a respective one of said first and second differential pairs in response to a respective side of said differential drive signal.

22. The amplifier of claim 17, wherein said initial transistors have initial current terminals and further including a common-mode feedback loop that controls a common-mode level of said initial current terminals in response to a common-mode reference signal.

23. The amplifier of claim 22, further including a bias network that provides an offset reference signal to said first and second differential pairs that is sufficiently offset from said common-mode level to terminate said response of said first and second differential pairs when the magnitude of said differential drive signal drops below a predetermined level.

24. The system of claim 17, wherein said switched-capacitor structure further includes:

first and second sample switches that close during said sample mode;

a sample capacitor coupled between said first and second sample switches; and a transfer switch which closes during said transfer mode and which is coupled in series with said sample and transfer capacitors.

25. The system of claim 24, wherein said transfer switch is arranged to apply selected offset signals to said sample capacitor.

* * * * *